United States Patent [19]

Chou et al.

[11] Patent Number: 4,468,854
[45] Date of Patent: Sep. 4, 1984

[54] METHOD AND APPARATUS FOR MANUFACTURING THERMOELECTRIC DEVICES

[75] Inventors: Der-Jeou Chou, Troy, Mich.; Tetsuo Maruyama, Tokyo, Japan

[73] Assignee: ECD-ANR Energy Conversion Company, Troy, Mich.

[21] Appl. No.: 373,120

[22] Filed: Apr. 29, 1982

[51] Int. Cl.³ .............................................. H01L 21/68
[52] U.S. Cl. ...................................... 29/573; 29/588; 29/856; 269/21
[58] Field of Search ................. 29/573, 588, 854, 855, 29/856, 743; 136/201, 230; 269/21

[56] References Cited

U.S. PATENT DOCUMENTS

| | | | |
|---|---|---|---|
| 2,980,746 | 4/1961 | Claydon | 29/573 |
| 3,076,051 | 1/1963 | Haba | 29/856 X |
| 3,252,205 | 5/1966 | Hancock et al. | 29/573 |
| 3,409,475 | 11/1968 | Breneman | 136/203 |
| 3,451,131 | 6/1969 | Gruenstein | 29/856 |
| 3,509,620 | 5/1970 | Phillips | 29/573 |
| 3,580,743 | 5/1971 | MacPhee et al. | 29/573 X |
| 3,729,796 | 5/1973 | Sell et al. | 29/743 X |
| 3,976,288 | 8/1976 | Cuomo | 269/21 |
| 4,149,025 | 4/1979 | Niculescu | 29/573 X |

Primary Examiner—Brian E. Hearn
Assistant Examiner—David A. Hey
Attorney, Agent, or Firm—Lawrence G. Norris

[57] ABSTRACT

An apparatus for manufacturing thermoelectric devices includes two conductive strip receiving fixtures, a thermoelectric element receiving fixture and a u-shaped member. The conductive strip receiving fixtures act to retain the strips in proper registry during the processing steps of screen printing insulating material, or solder paste thereon as well as during attachment of thermoelectric elements thereto. The element receiving fixture is complemental with either of the strip receiving fixtures to maintain the elements in place during the coupling of the elements to the strips in one of the strip receiving fixtures. The strip receiving fixtures are complemental with the u-shaped member to complete the coupling of the elements to the strips such that the elements are coupled thermally in parallel and electrically in series. The u-shaped member also facilitates the introduction of a ceramic potting compound therebetween.

Also disclosed is a method for manufacturing a thermoelectric device.

18 Claims, 9 Drawing Figures

METHOD AND APPARATUS FOR MANUFACTURING THERMOELECTRIC DEVICES

BACKGROUND

The present invention relates to a new and improved method and apparatus for manufacturing thermoelectric devices of the type utilized in the generation of electricity from heat.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new methods and apparatuses for commercially producing thermoelectric devices which provide more electricity.

An important part of the solution with respect to the development of permanent, economical energy conversion lies in the field of thermoelectrics wherein electrical power is generated from heat. It has been estimated that more than two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level.

The efficiency of a thermoelectric device can be expressed in terms of a figure of merit (Z) for the material forming the device, wherein Z is defined as:

$$Z = S^2 \sigma / K$$

Where:
 Z is expressed in units $\times 10^3/°C$.
 S is the Seebeck coefficient in $\mu V/°C$.
 K is the thermal conductivity in $mW/cm-°C$.
 $\sigma$ is the electrical conductivity in $(\Omega-cm)^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K):$K_l$, the lattice component; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are $(Bi,Sb)_2Te_3$, PbTe, and Si-Ge. The $(Bi,Sb)_2Te_3$ materials are best suited for applications in the $-10°$ C. $+150°$ C. range with its best Z appearing at around 30° C. $(Bi,Sb)_2Te_3$ represents a continuous solid solution system in which the relative amount of Bi and Sb are from 0 to 100%. The Si-Ge material is best suited for high temperature applications in the 600° C. to 1000° C. range with a satisfactory Z appearing at above 700° C. The PbTe polycrystalline material exhibits its best figure of merit in the 300° C. to 500° C. range. None of these materials is well suited for applications in the 100° C. to 300° C. range. This is indeed unfortunate, because it is in this temperature range where a wide variety of waste heat applications are found. Among such applications are geothermal waste heat and waste heat from internal combustion engines in, for example, trucks, buses, and automobiles. Applications of this kind are important because the heat is truly waste heat. Heat in the higher temperature ranges must be intentionally generated with other fuels and therefore is not truly waste heat.

New and improved thermoelectric alloy materials have been discovered for use in the aforesaid temperature ranges. These materials are disclosed and claimed in copending U.S. application Ser. No. 341,864, filed Jan. 22, 1982 in the names of Tumkur S. Jayadev and On Van Nguyen for NEW MULTIPHASE THERMOELECTRIC ALLOYS AND METHOD OF MAKING SAME, now abandoned in favor of continuation-in-part application Ser. No. 412,306, filed Jan. 17, 1983 and allowed Sept. 26, 1983, which application is incorporated herein by reference.

The thermoelectric materials there disclosed can be utilized in the thermoelectric devices manufactured by the method and apparatus herein. These materials are not single phase crystalline materials, but instead, are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials, the material is designed such that the grain boundaries define regions including conductive phases therein providing numerous electrical conduction paths through the bulk material for increasing electrical conductivity without substantially effecting the thermal conductivity. In essence, these materials have all of the advantages of polycrystalline materials in desirably low thermal conductivities and crystalline bulk Seebeck properties. However, unlike the conventional polycrystalline materials, these disordered multiphase materials also have desirably high electrical conductivities. Hence, as disclosed in the aforesaid referenced application, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474, and 4,178,415 which issued in the name of Stanford R. Ovshinsky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the heretofore mentioned independently increased electrical conductivities. In contrast, the materials disclosed in the aforesaid referenced application are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

A thermoelectric device generates electricity by the establishment of a temperature differential across the materials contained therein. The thermoelectric devices generally include elements of both p-type and n-type material. In the p-type material the temperature differential drives positively charged carriers from the hot side to the cold side of the elements, while in the n-type material the temperature differential drives negatively charged carriers from the hot side to the cold side of the elements.

Thermoelectric power conversion has not found wide usage in the past not only because of material limitations but also because of device limitations. One serious limitation exhibited by such devices results from the use of relatively thick ceramic substrates. The substrates, because of their coefficient of thermal expansion, bow or warp during manufacture and subsequent use. This results in heat transfer losses between the devices and their associated heat exchanger because the warping precludes broad surface contact therebetween. Also the substrates add significant thermal resistance in series with the thermoelectric elements of the devices to further increase heat transfer losses.

A new and improved thermoelectric device has been discovered overcoming the above-stated device limitations. This device and a method of making same is disclosed and claimed in co-pending U.S. application Ser. No. 372,688, filed Apr. 28, 1982 in the name of Der-Jeou Chou for IMPROVED THERMOELECTRIC DEVICE AND METHOD OF MAKING SAME, allowed Mar. 7, 1984, which application is incorporated herein by reference.

As disclosed therein, bowing or warping of the device is prevented during manufacture and use thereof. This device configuration not only eliminates the need for the ceramic substrates but also minimizes the effects of thermal expansion of the other device components by both evenly distributing and absorbing the expansion throughout the device that does occur. Thus, broad surface contact between the device and a heat exchanger can be readily maintained when utilized in a thermoelectric system. Because the device there disclosed eliminates the ceramic substrates, the thermal resistance in series with the device elements is also reduced to allow a greater temperature differential to exist across the thermoelectric elements for increasing the obtainable electric power output for a given total temperature differential.

The cost effectiveness of thermoelectric power conversion and its acceptance in the market place is further influenced, not only by efficient thermoelectric materials and devices as discussed above, but also by the ability to produce the devices on a commercial cost effective scale. The present invention provides such a method and apparatus for mass producing thermoelectric devices on a cost effective, commercial scale.

SUMMARY OF THE INVENTION

The present invention provides a new and improved method and apparatus for manufacturing thermoelectric devices. The apparatus of the present invention includes fixture means adapted to receive and maintain a plurality of planar conductive strips and a plurality of thermoelectric elements in proper registration during the manufacture of the device. The fixture means is arranged to dispose the planar conductive strips in a pattern to couple the thermoelectric elements thermally in parallel and electrically in series. The new apparatus aids in decreasing production time and cost while providing a high quality, efficient thermoelectric device for the generation of electricity. The new apparatus and method also readily lends itself to the mass production of thermoelectric devices on a commercial scale.

The apparatus of the present invention includes three fixtures or jigs and a u-shaped member. Two of the fixtures includes recessed portions adapted to receive copper plate segments. These fixtures retain the copper plate segments within the recessed portion by means of a vacuum applied through the fixtures to a side of the copper plate segments not currently exposed to processing. The two fixtures include depending lips about three-fourths of their periphery.

The third fixture is complemental with the first fixture during a portion of the manufacturing operation. The third fixture is utilized to maintain the thermoelectric elements in their proper position during their coupling to the copper plate segments in the first fixture by, for example, soldering. The complemental arrangement of the first and third fixtures is accomplished by flanges on a portion of the periphery of the third fixture meshing with the depending lips of the first fixture. This arrangement registers the elements with respect to the copper plate segments of the first fixture during the soldering operation. Once the thermoelectric elements are soldered to the segments of the first fixture, the third fixture is removed.

The first fixture, second fixture and u-shaped member are then joined in proper registry to facilitate coupling of the elements to the copper plate segments of the second fixture. The depending lips on each of the two fixtures are in complemental arrangement with the u-shaped member when the u-shaped member is therebetween. The u-shaped member acts to register one fixture with respect to the other so that the exposed surfaces of the copper plate segments are spaced apart such that the thermoelectric elements are disposed therebetween. The copper plate segments of the second fixture are then soldered to the thermoelectric elements. The two fixtures and u-shaped member are arranged to dispose the copper plate segments in a pattern to couple the thermoelectric elements electrically in series and thermally in parallel.

After the soldering operation is complete a ceramic potting compound is introduced about the segments and elements. This operation is facilitated by the two fixtures and u-shaped member, in proper registry, defining an enclosure about the segments and elements to enable the introduction of the compound therein. One of the two fixtures is longer than the other and the u-shaped member to provide for a pair of segments to partially extend beyond the enclosure. This configuration provides electrical contacts for coupling of the thermoelectric device. Once the compound dries, the device is complete.

The above described new and improved apparatus may be used to manufacture thermoelectric devices in accordance with the method of the present invention. The method is initiated by placing a plurality of copper plate segments in each of the two fixtures. The exposed surface of each of the copper plate segments is then coated with an insulating material, dried and fired. The copper plate segments are then reversed in the fixtures to expose the opposite, uncoated surfaces of the segments. The surfaces of the copper plate segments not coated with the insulating material are then coated with solder paste and dried. The segments in one fixture are coated with a solder paste which reflows at a higher temperature than the solder paste coated onto the segments of the other fixture.

A third fixture is brought into registry with the first fixture retaining the copper plate segments having the higher temperature reflow solder thereon. The elements are loaded into the third fixture and coupled to the segments of the first fixture by reflowing the higher temperature solder. The third fixture is removed leaving the elements coupled to the copper plate segments of the first fixture.

The two fixtures and the u-shaped member are then joined in proper registry to position the thermoelectric elements with respect to segments having the lower temperature reflowing solder thereon. The lower temperature solder is reflowed coupling the elements to the copper plate segments of the second fixture. The registry of the two fixtures by the u-shaped member define a pattern by which the copper plate segments connect the thermoelectric elements thermally in parallel and electrically in series.

Once the thermoelectric elements are coupled to the segments within the second fixture, a ceramic potting compound is then injected between the segments and about the elements. The injection of the ceramic potting compound is readily facilitated by the u-shaped member which, with the two fixtures, form a three sided enclosure about the elements and the segments. The ceramic potting compound is then dried. The two fixtures and u-shaped member are then removed and the finished thermoelectric device is ready for use to generate electricity responsive to a temperature differential applied thereacross.

DETAILED DESCRIPTION

In accordance with the present invention the new and improved apparatus and method for manufacturing thermoelectric devices shall now be described with reference to the drawings.

Figure 1:
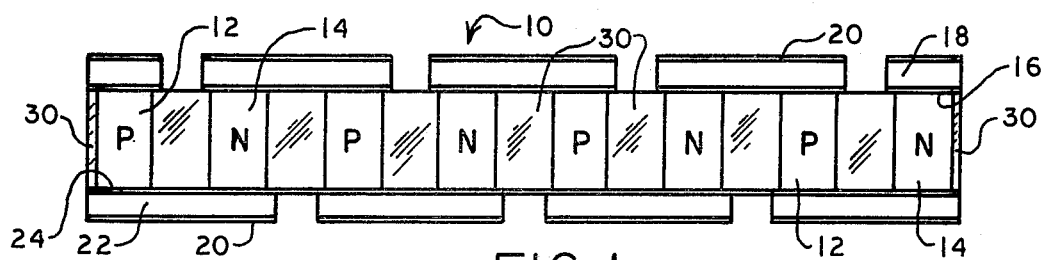
FIG. 1 is a side view of a thermoelectric device of the type which can be manufactured by the apparatus and method of the present invention.

FIG. 1 illustrates a substrateless thermoelectric device 10 embodying the invention of the aforementioned copending U.S. application Ser. No. 372,688 which is incorporated herein by reference. The device 10 generates electricity by the establishment of a temperature differential thereacross. The temperature differential drives flux through p-type and n-type thermoelectric elements 12 and 14. In the n-type element 14 the temperature differential drives negative carriers from the hot side to the cold side. In the p-type element 12 the temperature differential drives positive carriers from the hot side to the cold side. It is this movement of the positive and negative carriers which generates electricity.

The p-type and n-type thermoelectric elements 12 and 14 are equal in number and alternate throughout. A representative composition utilized for the p-type elements 12 comprises from about ten to twenty percent bismuth, about twenty to thirty percent antimony, about sixty percent tellurium, and less than one percent silver. This material and others from which the p-type elements can be formed are disclosed and claimed in the aforementioned U.S. application Ser. No. 412,306, filed Jan. 17, 1983, and allowed Sept. 26, 1983, for New Multiphase Thermoelectric Alloys and Method for Making Same, which is incorporated herein by reference. The n-type elements may comprise about forty percent bismuth, about fifty-four percent tellurium, and about six percent selenium.

Referring again to FIG. 1, the p-type and n-type elements 12 and 14 of the substrateless thermoelectric device 10 are thermally affixed to interior surfaces of spaced apart first and second sets of copper plate segments 22 and 18 respectively. The interior surfaces of the copper plate segments 18 and 22 have a solder 16 and 24 thereon for thermally and electrically connecting the elements 12 and 14 to the copper plate segments 18 and 22 respectively. The copper plate segments 18 and 22 define a lead pattern for connecting the elements 12 and 14 electrically in series and thermally in parallel.

A ceramic potting compound 30 such as Aremco 554 or the like for example, fills the voids between the elements 12 and 14 and the copper plate segments 18 and 22. The ceramic potting compound 30 has qualities of high electrical and thermal resistivity to insulate the elements and to protect the elements from contamination. The ceramic potting compound 30 also acts to absorb thermal expansion of the device during its use. The copper plate segments 18 and 22 also include a layer of a thick film ceramic 20 such as ESL M4906 manufactured by Electro-Science Laboratories, Inc. for example or the like, on the outer surfaces of the segments 18 and 22 opposite the solder paste 16 and 24. The thick film ceramic 20 has high electrical resistivity to electrically insulate the copper plate segments 18 and 22 from a heat exchanger when employed therewith and has a high thermal conductivity to maximize the temperature differential across the elements 12 and 14. The thick film ceramic 20 therefore serves the dual function of electrically insulating the thermoelectric device 10, while thermally coupling the device 10 to a heat exchanger when utilized in a thermoelectric system to generate electricity.

The thermoelectric device 10 is manufactured in accordance with the method of the present invention by providing relatively thin and substantially planar first and second sets of copper plate segments 18 and 22. The copper plate segments 18 and 22 are about 0.020 inches in thickness.

A thick film ceramic paste 20 is screen printed on the opposite side of each of the copper plate segments. The thick film ceramic paste 20 has the characteristics of being a good electrical insulator and a good thermal conductor and may be ESL M4906 or the like for example. The thick film ceramic is dried at 125° C. for 15 minutes and then fired for 30 minutes at 900° C. After the thick film has been fired, solder pastes 16 and 24 are screen printed upon copper plate segments 18 and 22 respectively. The copper plate segments with the solder paste thereon are then dried at about 120° C. for 15 minutes.

The two sets of copper plate segments are arranged in a pattern such that the solder paste coated surfaces of the first and second sets are spaced apart. The copper segments of each set are then arranged with respect to one another in a pattern to electrically couple thermoelectric elements disposed therebetween in series.

The p-type and n-type elements 12 and 14 are connected to the copper plate segments 22 in equal number and alternating throughout, by reflowing the solder paste 24 in the presence of a reducing atmosphere, such as nitrogen for example, at about 350° C. The p-type and n-type elements 12 and 14 with the copper plate segments 22 thereon, are then placed upon copper plate segments 18 so that the solder paste 16 contacts the elements. The solder paste 16 is then reflowed in a reducing atmosphere at a temperature of about 300° C. or lower to connect the elements 12 and 14 to the copper plate segments 18.

The solder paste 16 is choosen to melt at a lower temperature than that of the solder paste 24. This facilitates the assembly of the copper plate segments 18 and 22 to the thermoelectric elements 12 and 14 without melting the previously reflowed solder 24.

The ceramic potting compound 30 is injected into the area between the copper plate segments 18 and 22 and the elements 12 and 14. The ceramic potting compound exhibits the qualities of high thermal and electrical resistivity and may be Aremco 554 or the like for example. The ceramic potting compound 30 is dried for 24 hours at 90° C. The compound acts to absorb thermal expansion of the device while in use to maintain broad surface contact between the elements and the segments. Further, the compound 30 protects the elements 12 and 14 from the environment and possible contamination therefrom.

Figure 2:
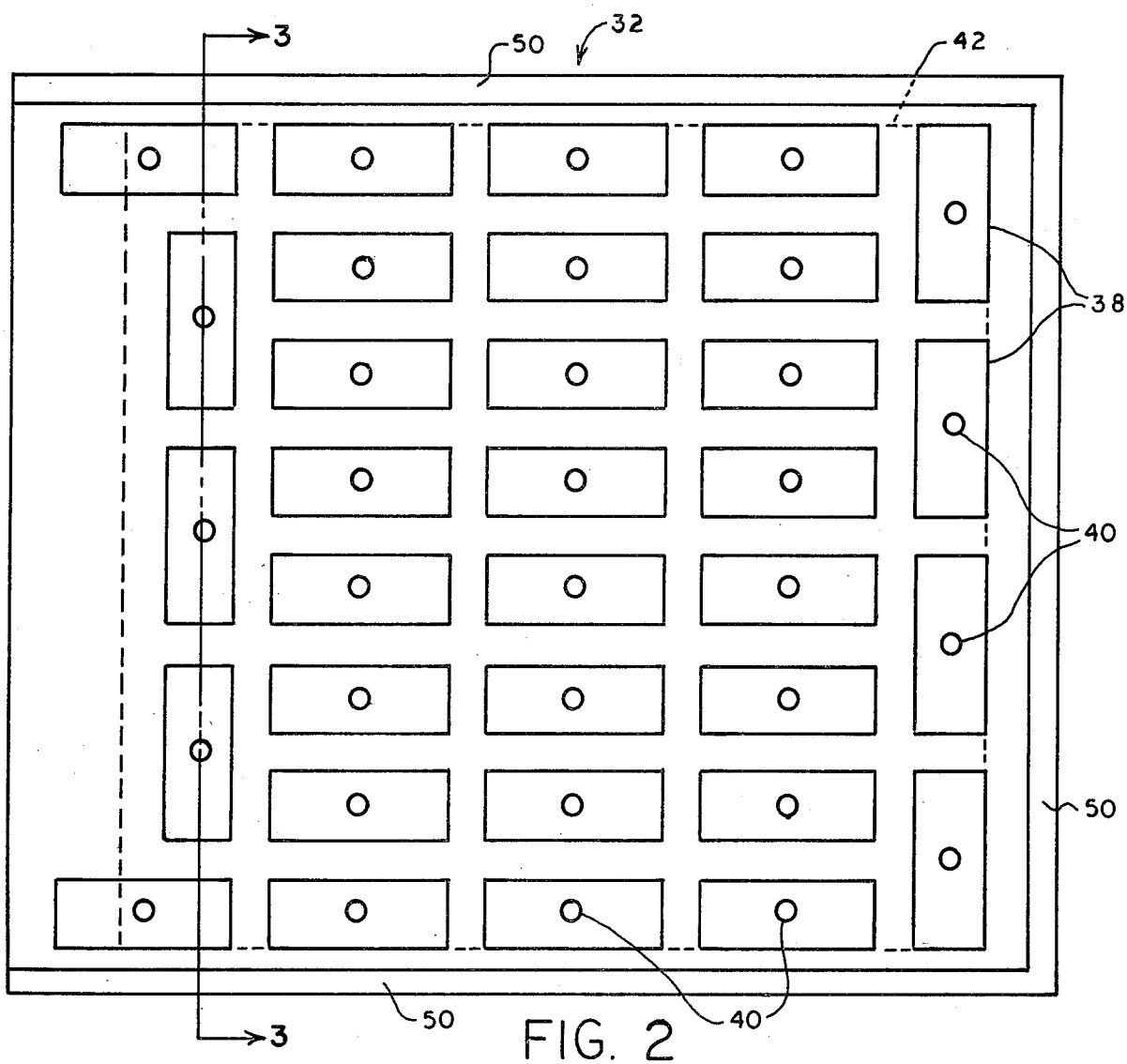
FIG. 2 is a top plan view of a first fixture of the apparatus adapted to receive a first set of copper plate segments in a predetermined pattern in accordance with the present invention.
Figure 3:
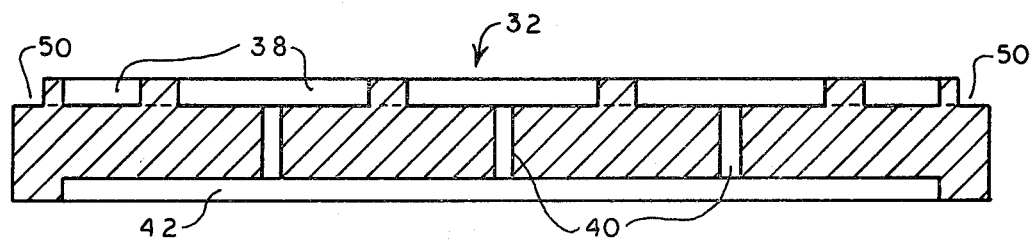
FIG. 3 is a view taken along lines 3—3 of FIG. 2.

The new and improved apparatus of the present invention utilized in the method of manufacturing as hereinabove described is shown in FIGS. 2–9. The apparatus is made up of three fixtures or jigs 32, 34, 36 and u-shaped member 37. Referring more specifically to FIGS. 2 and 3, fixture 32 is adapted to receive a set of copper plate segments in recessed areas 38. The recessed areas 38 approximate the size of the copper plate segments and maintain the copper plate segments in proper position during processing. The segments are prevented from moving once in the recessed areas by the application of a vacuum to the sides of the segments not exposed to processing. The vacuum is applied to each segment in each recessed area 38 through conduits 40. The conduits 40 connect each recessed area 38 to a vacuum manifold 42 which facilitates the application of a vacuum to the fixture 32. Fixture 32 further includes a depending lip 50 situated about three quarters of its periphery.

Figure 4:
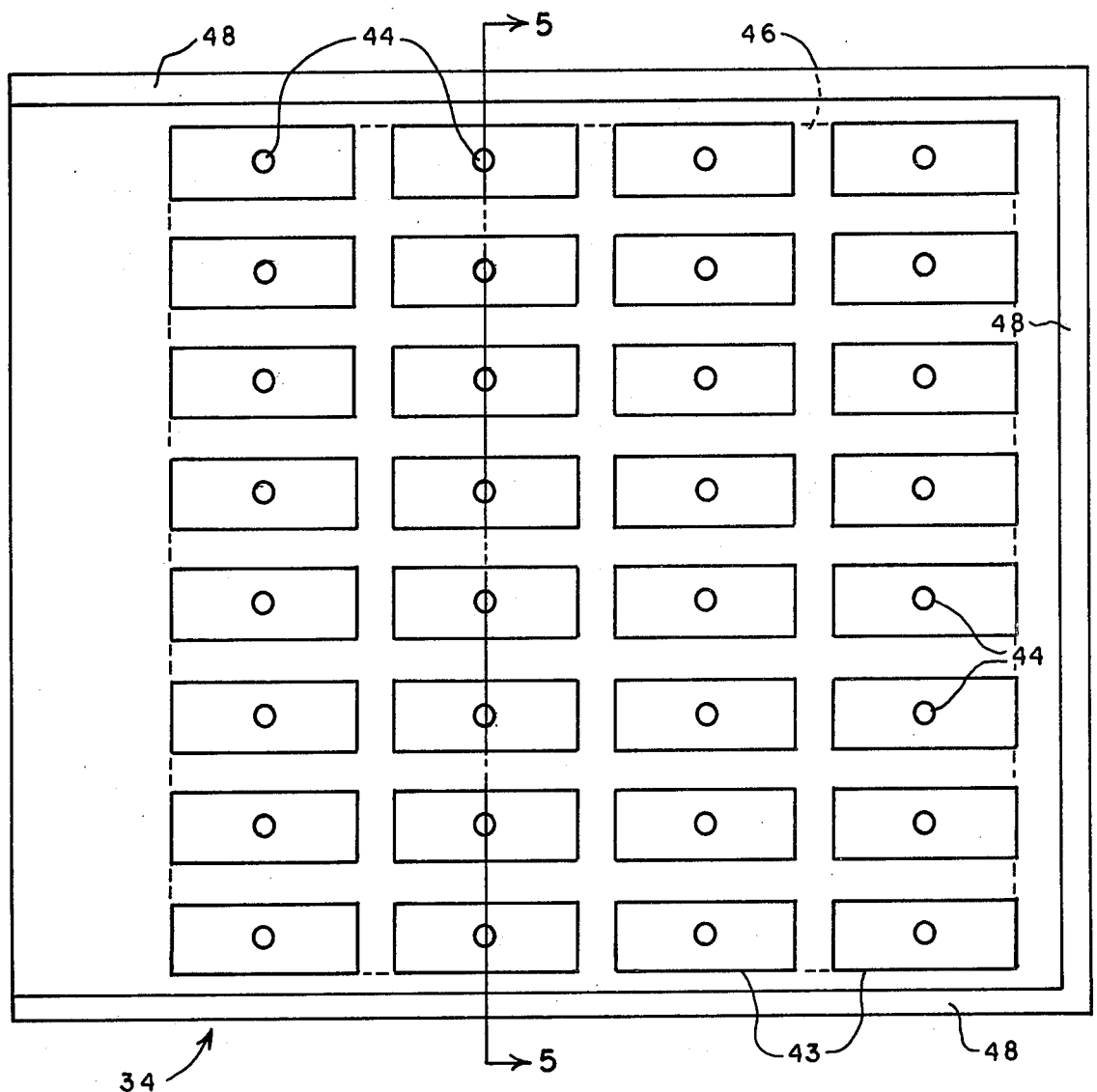
FIG. 4 is a top plan view of a second fixture of the apparatus adapted to receive a second set of copper plate segments in a predetermined pattern in accordance with the present invention.
Figure 5:
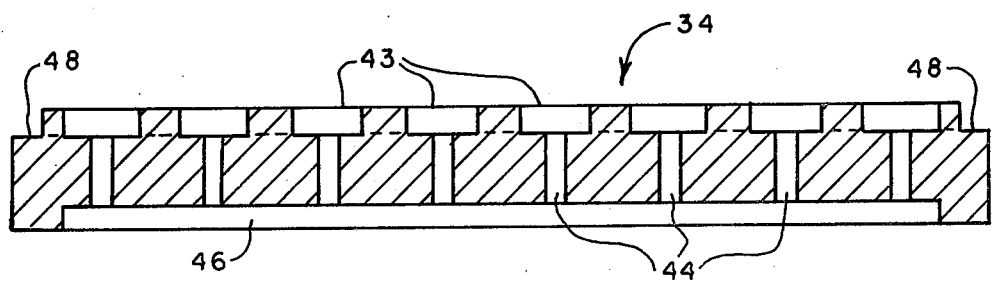
FIG. 5 is a view taken along lines 5—5 of FIG. 4.

Referring now to FIGS. 4 and 5, fixture 34 is also adapted to receive a set of copper plate segments in its recessed areas 43. The segments are held in proper position by the application of a vacuum on the side of the segments not exposed to processing through conduits 44 connecting the recessed areas 43 to a vacuum manifold 46. Fixture 34 also has a depending lip 48 situated about three-quarters of its periphery.

Fixture 32 is slightly longer than fixture 34 and u-shaped member 37. Therefore, with fixtures 32 and 34 in proper registry with u-shaped member 37, two of the recessed areas 38 of fixture 32 are not within the cavity formed thereby. This configuration provides for two copper plate segments to protrude from the ceramic potting compound filling the cavity to act as electrical contacts for coupling of the thermoelectric device.

Figure 6:
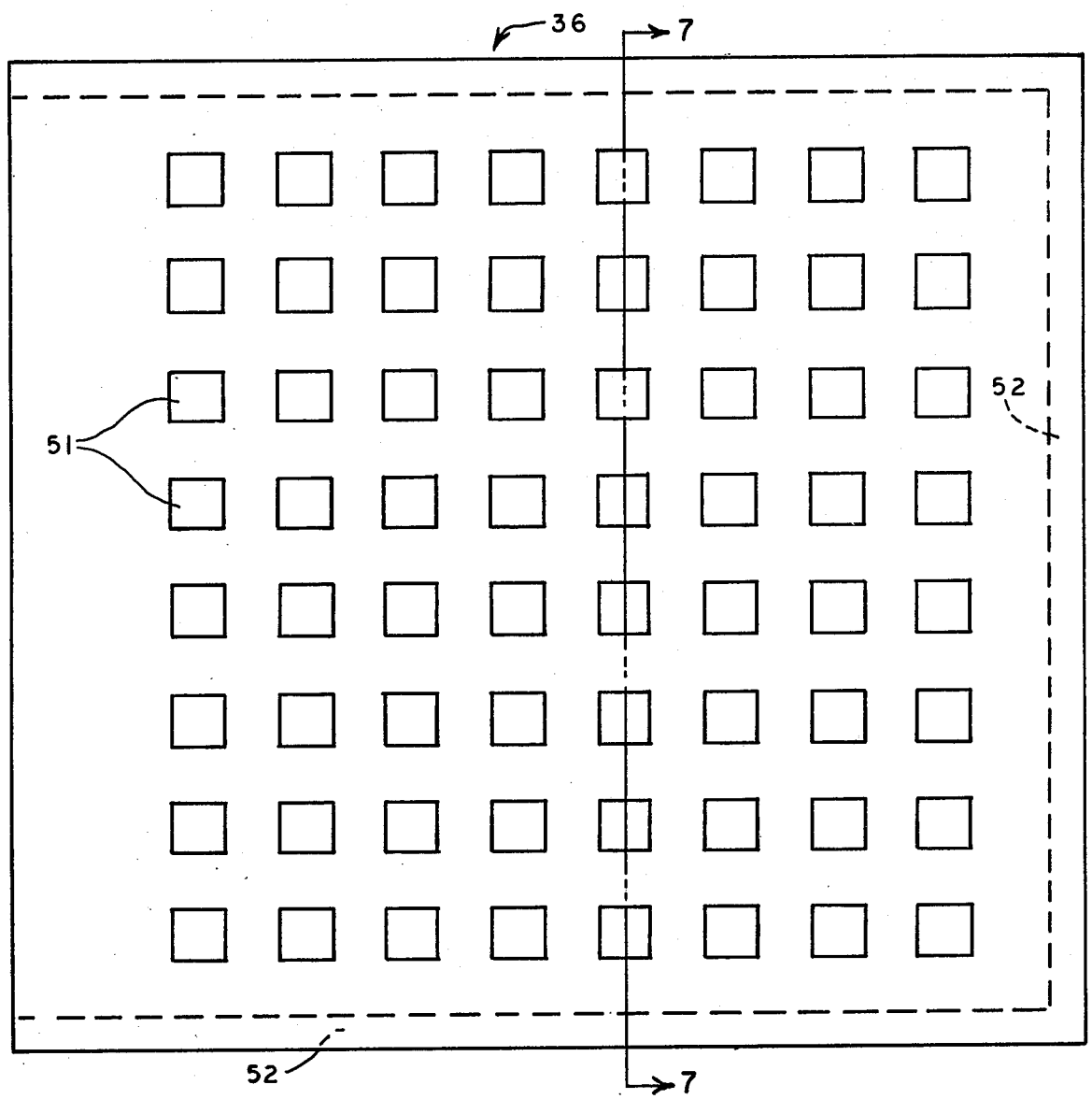
FIG. 6 is a top plan view of a third fixture of the apparatus adapted to receive thermoelectric elements in a predetermined pattern in accordance with the present invention.
Figure 7:
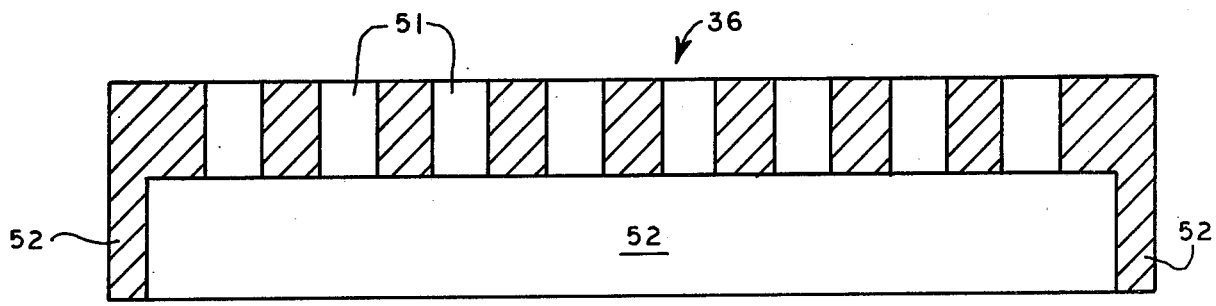
FIG. 7 is a view taken along lines 7—7 of FIG. 6.

The new and improved apparatus also includes a third fixture or jig 36 as seen in FIG. 6 and 7. The third fixture 36 has cutouts or apertures 51 arranged in a preselected pattern throughout. There are an even number of cutouts 51 spaced throughout the fixture 36. The cutouts are for receiving and maintaining the equal number of alternating p-type and n-type elements in place during their coupling to one set of copper plate segments. The third fixture 36 also includes a flange 52 about a portion of its perimeter. Flange 52 is complemental with either of the depending lips 48 or 50 to provide the proper orientation of the thermoelectric elements to the copper plate segments during the coupling of the elements to one set of segments.

The lip 48 of fixture 34 is complemental with the u-shaped member 37 which is in turn complemental with a depending lip 50 of fixture 32. Both the depending lips 48 and 50 act to provide proper registry of fixtures 32 and 34 when placed together, with the u-shaped member 37 therebetween, to dispose the copper plate segments in spaced apart relation. The depending lips 48, 50 and u-shaped member 37 also provide the proper orientation of the elements with the copper plate segments to couple the thermoelectric elements thermally in parallel and electrically in series. Lastly, the depending lips 48 and 50 along with the u-shaped member 37 act conjointly to form a cavity about the segments and elements to facilitate the injection of a ceramic potting compound therebetween.

Figure 8:
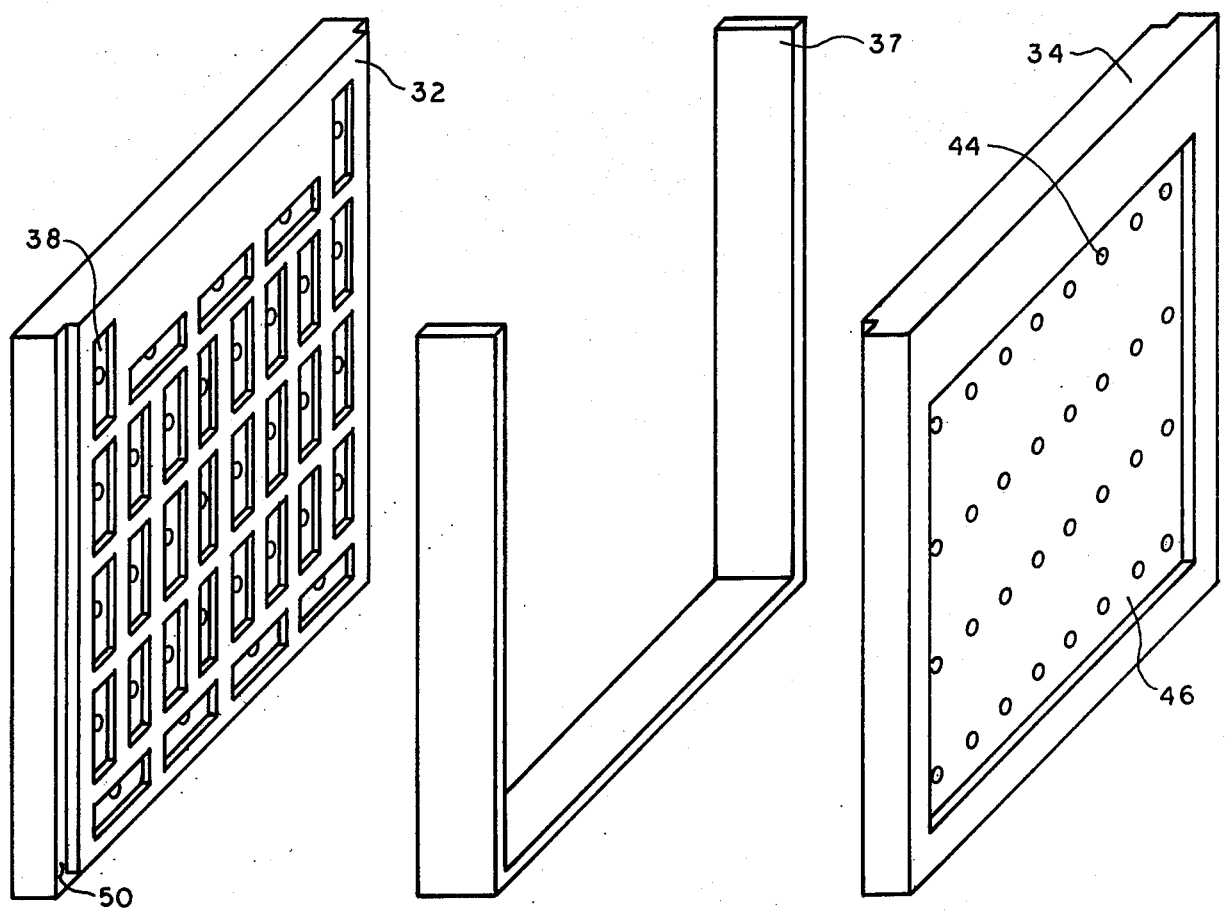
FIG. 8 is an exploded view showing the registry of the first fixture, second fixture and a u-shaped member of the apparatus in accordance with the present invention.

As can be readily seen with the aid of FIGS. 8 and 9, the new and improved apparatus of the present invention is readily usable in the new and improved method hereinabove described. Copper plate segments 22 are received by fixture 32 in recessed areas 38 and copper plate segments 18 are received by fixture 34 in recessed areas 43. A vacuum is applied to each fixture through its respective vacuum manifold 42, 46 and conduits 40 and 44 to retain the segments 18 and 22 in place during processing. The insulating material 20 is screen printed on the side of the segments exposed to processing, dried for about 15 minutes at about 125° C. and then fired for about 30 minutes at about 900° C. The vacuum is then disengaged to allow the segments to be turned over to expose the surface of the segments opposite the insulating material for further processing. This can be accomplished most preferably by placing the fixture with the segments therein atop a like fixture, disengaging the vacuum to allow the segments to drop into the recessed areas of the like fixture with their unprocessed sides exposed.

A vacuum is then applied to the segments and the exposed surfaces of segments 22 and 18 are screen printed with solder pastes 24 and 16 respectively and dried at about 120° C. for about 15 minutes. Solder paste 24 reflows at a higher temperature than the solder paste 16 to facilitate the coupling of the thermoelectric elements 12 and 14 to the segments 22 and 18.

The fixture 36 is then placed above fixture 32 in proper registry. The proper registry is automatically provided by the complemental flange 52 of fixture 36 and depending lip 50 of fixture 32. The p-type and n-type thermoelectric elements are placed in the cutouts 51 of fixture 36 in equal number and alternating throughout. The elements are coupled to the segments 22 in fixture 32 by reflowing solder paste 24 in a reducing atmosphere at about 350° C. Once the elements are coupled to segments 22 the fixture 36 is removed.

Fixture 32, with the elements coupled to segments 22, is placed in proper registry with respect to fixture 34 with the u-shaped member 37 therebetween. The proper registry is automatically provided by depending lips 48 and 50 of the fixtures 32 and 34 being in complemental arrangement with u-shaped member 37. This arrangement provides for the coupling of the elements to the segments such that the elements are connected thermally in parallel and electrically in series. The elements are then coupled to segments 18 by reflowing solder paste 16 in a reducing atmosphere at about 300° C.

Figure 9:
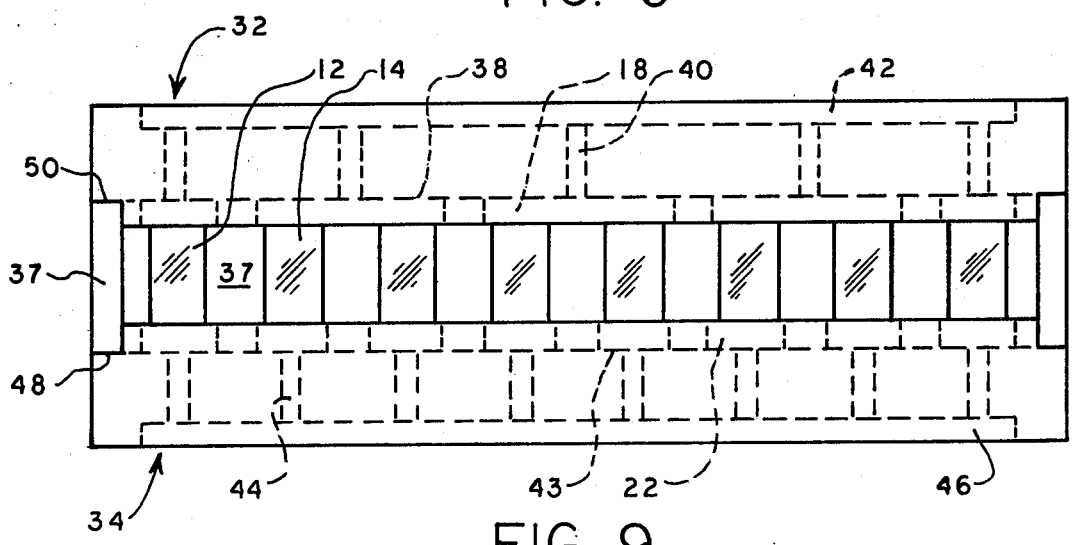
FIG. 9 is a side view of the first fixture, second fixture and u-shaped member of the apparatus joined in proper registry in accordance with the present invention.

After the coupling of the elements to the segments and with the fixtures 32, 34 and u-shaped member 37 still in registry, as best seen in FIG. 9, a ceramic potting compound 30 is injected between the elements and segments. The fixtures 32, 34 and u-shaped member 37 facilitate the operation of injecting the compound 30 by forming a cavity about the elements and segments. Once the compound 30 has dried for 24 hours at 90° C., the fixtures 32, 34 and u-shaped member 37 are disengaged allowing the finished thermoelectric device 10 to be removed.

The apparatus and method of the present invention helps to decrease production time and cost of manufacturing thermoelectric devices. The present invention also readily adapts itself for the automatic, high speed mass production of thermoelectric devices on a commerical scale.

Modifications and variations of the present invention are possible in light of the above teachings. It is therefore, to be understood that within the scope of the appended claims the invention may be practiced otherwise than as specifically described.

We claim:

1. A method of manufacturing a thermoelectric device comprising the steps of:
   providing at least two fixtures;
   providing a plurality of substantially planar conductive strips;
   placing said plurality of substantially planar conductive strips in each of said two fixtures;
   coating the exposed surface of each of said conductive strips with a first insulating material which exhibits low electrical conductivity and high thermal conductivity;
   reversing said strips in said fixtures to expose a surface parallel to said coated surface;
   coating said parallel surface with a solder paste;
   providing a plurality of thermoelectric elements;
   registering said fixtures one above the other and disposing said elements between said solder paste coated surfaces;
   fastening said elements to be conductive strips; and
   injecting a second insulating material between said elements and said fixtures.

2. The method as defined in claim 1 including the further step of providing planar strip receiving means in said fixtures arranged to receive and dispose said conductive strips in a pattern for coupling said thermoelectric elements thermally in parallel and electrically in series when said fixtures are in registry.

3. The method as defined in claim 2 including the further step of applying a vacuum to said conductive strips to maintain said strips in place during processing.

4. The method as defined in claim 3 including the further step of applying said vacuum through said fixture.

5. The method as defined in claim 3 wherein said solder paste applied to said strips in said one fixture reflows at a higher temperature than said solder paste applied to said strips in said other fixture.

6. The method as defined in claim 5 including the further step of rotating said fixtures so that said fixture with said strips having said higher temperature reflowing solder is below said other fixture.

7. The method as defined in claim 6 including the further step of reflowing said higher temperature reflowing solder in a reducing atmosphere to fasten said thermoelectric elements thereto.

8. The method as defined in claim 7 including the further step of rotating said fixtures so that said fixture with said strips having said lower temperature reflowing solder is below said other fixture.

9. The method as defined in claim 8 including the further step of reflowing said lower temperature reflowing solder in a reducing atmosphere to fasten said thermoelectric elements thereto.

10. The method as defined in claim 7 including the further step of providing an aligning fixture in registry with one of said two fixtures for maintaining said thermoelectric elements in place during the reflowing of said higher temperature reflowing solder.

11. The method as defined in claims 1, 2, 4 or 10 including the further step of providing cavity forming means for guiding said two fixtures into registry with each other and for forming a cavity about said conductive strips and thermoelectric elements facilitating the injection of said second material.

12. The method as defined in claim 1, wherein said insulating material is a thick film ceramic.

13. The method as defined in claim 1 or 2 wherein said second insulating material is a potting ceramic.

14. The method as defined in claim 1 or 2 wherein said conducting strips are copper.

15. The method as defined in claim 1, 2, or 12 wherein said step of applying said insulating material to said conductive strips includes the further step of screen printing said insulating material on said conducting strips.

16. The method as defined in claim 1, 2 or 5 wherein said step of applying said solder pastes includes the further step of screen printing said solder pastes on said conducting strips.

17. The method as defined in claim 2 including the further step of providing said plurality of thermoelectric elements equal number of p-type and n-type elements.

18. The method as defined in claim 16 including the further step of alternating said p-type and n-type elements throughout said device.

* * * * *